United States Patent [19]
Ueda et al.

[11] Patent Number: 5,196,917
[45] Date of Patent: Mar. 23, 1993

[54] CARRIER TAPE

[75] Inventors: Tetsuya Ueda; Kou Shimomura; Osamu Nakagawa; Seiji Takemura; Kazunari Michii, all of Itami, Japan

[73] Assignee: Mitsubishi Denki Kabushiki Kaisha, Tokyo, Japan

[21] Appl. No.: 444,973

[22] Filed: Dec. 4, 1989

[30] Foreign Application Priority Data

Aug. 22, 1989 [JP] Japan .................. 1-214165

[51] Int. Cl.⁵ .......................................... H01L 23/48
[52] U.S. Cl. ............................................ 357/70; 357/80
[58] Field of Search ....................... 357/70, 80, 68, 74

[56] References Cited

U.S. PATENT DOCUMENTS

| | | | |
|---|---|---|---|
| 4,803,542 | 2/1989 | Tohrani | 357/80 |
| 4,915,607 | 4/1990 | Medders et al. | 264/272.17 |
| 4,967,260 | 11/1990 | Butt | 357/80 |
| 5,018,003 | 5/1991 | Yasunaga et al. | 357/72 |
| 5,064,706 | 11/1991 | Ueda et al. | 438/131 |

Primary Examiner—Robert J. Pascal
Assistant Examiner—R. A. Ratliff
Attorney, Agent, or Firm—Leydig, Voit & Mayer

[57] ABSTRACT

A carrier tape includes an insulating film supporting a plurality of leads. The film has a center device hole for receiving a semiconductor chip therein, a plurality of outer lead holes formed at the periphery of the center device hole, a lead supporting portion positioned between the center device hole and the outer lead holes, and a link portion positioned between a pair of adjacent outer lead holes and connected to the lead supporting portion for directing the flow of molten resin during encapsulation of the semiconductor chip. The link portion includes an opening or recess. The plurality of leads of the carrier tape are supported on the lead supporting of the film, with one end portion of each lead projecting into the center device hole of the film. During manufacture, a semiconductor chip having a plurality of electrodes is positioned within the center device hole, and the leads are electrically connected to respective electrodes of the semiconductor chip. The resultant chip is placed within a cavity of a mold, and a molten resin is injected into the cavity through the opening or recess passage formed in the link portion of the film.

3 Claims, 6 Drawing Sheets

CARRIER TAPE

BACKGROUND OF THE INVENTION

1. Field of the Invention

The present invention relates to a carrier tape on which semiconductor chips are to be mounted in a tape automated bonding (TAB) method, and also relates to a method of manufacturing a semiconductor device employing the carrier tape.

2. Description of the Related Art

FIGS. 7A and 7B are a plan view and a sectional view, respectively, of a part of a conventional carrier tape on which a semiconductor chip is mounted. The carrier tape has a film 1 formed of an insulating material such as polyimide. The film 1 has a plurality of perforations 6 formed at equal intervals along the edges of the film, and a rectangular center device hole 3 formed centrally between the edges of the film for receiving a semiconductor chip 2. A plurality of outer lead holes 5 are formed at the periphery of the center device hole 3. A plurality of leads 4 formed of copper are secured to the surface of the film 1. These leads 4 are supported by a lead supporting portion 7 positioned between the center device hole 3 and the outer lead holes 5. A front end portion of each lead 4 projects into the center device hole 3 as an inner lead 4a, while an intermediate portion of the lead 4 is positioned above the corresponding outer lead hole 5 as an outer lead 4b which is to be connected to an external circuit. A test pad 4c is formed at the rear end of each lead 4. The lead supporting portion 7 is linked to portions of the film 1 by bridge portions 8 each positioned between two adjacent outer lead holes 5.

As shown in FIG. 7B, within the center device hole 3 of the carrier tape, the inner lead 4a of each lead 4 is connected to a bump electrode 21 of the semiconductor chip 2. The semiconductor chip 2 and the associated part of the carrier tape constitute a tape carrier.

Such a tape carrier is sealed with a resin package, in order to protect the semiconductor chip 2, the leads 4, etc. from external forces and the external environment. The resin package is molded using, for instance, an upper mold part 10a and a lower mold part 10b, shown in FIG. 8. During resin molding, the tape carrier is set between the upper mold part 10a and the lower mold part 10b. At this time, the tape carrier is aligned in such a manner that the semiconductor chip 2 is received in a cavity half 12b of the lower mold part 10b. Thereafter, the upper mold part 10a and the lower mold part 10b are clamped, and a molten resin 11 is injected into a cavity defined by a cavity half 12a of the upper mold part 10a and the cavity half 12b of the lower mold part 10b, through a groove-shaped gate 13 and a gate land 13a formed in the upper mold part 10a. After the curing of the resin 11, a molded product, such as that shown in FIG. 9, is obtained. After the molded product has been taken out from the upper and lower mold parts 10a and 10b, the so-called gate-breaking process is executed. In this process, the molded resin 11 is broken at a portion 11a corresponding to the gate land 13a of the upper mold part 10a, thereby removing an unnecessary, gate-corresponding resin portion 11b. Furthermore, each of the leads 4 is cut along the boundary between the outer lead 4b and the test pad 4c, and each of the bridge portions 8 of the film 1 is cut off, thereby obtaining a semiconductor device.

The above described art, however, involves the following problems. Since the groove-shaped gate 13 of the upper mold part 10a is positioned above lead hole 5a, one of the outer lead holes 5 of the film 1, as shown in FIG. 8, during resin molding, molten resin 11 which is to be injected into the cavity flows through the gate 13 in the direction indicated by an arrow A in FIG. 7A. As a result, the resin 11 enters not only the cavity but also the outer lead hole 5a of the film 1, whereby an unnecessary molded resin portion 11c, disposed partially within the land-corresponding resin portion 11a, is formed, as shown in FIG. 9. Accordingly, it is necessary to perform, after the resin molding process, the process of removing an unnecessary molded resin portion 11c, thereby inevitably complicating the manufacture of the semiconductor device.

In addition, since the leads 4 generally have a relatively small thickness of about 35 μm, the outer leads 4b tend to be broken when the unnecessary molded resin portion 11c is being removed. If the leads break the semiconductor device is unreliable.

Furthermore, when, with a view to rendering the entire structure of a semiconductor device thin, the thickness of that resin portion over the semiconductor chip 2 is reduced, as shown in FIG. 9, the thickness t2 the molded resin 11 on the lead supporting portion 7 of the film 1 becomes relatively thin compared with the thickness t1 of the resin portion 11a corresponding to the gate land 13a of the upper mold part 10a. Accordingly, there is a risk that a package-forming portion of the molded resin 11 may chip during the gate-breaking process, thereby opening the package and leading to a degradation in the qualities of the semiconductor device.

SUMMARY OF THE INVENTION

The present invention has been accomplished in order to overcome the above-described problems. An object of the present invention is to provide a carrier type capable of facilitating the manufacture of semiconductor devices assuring high reliability and high qualities.

Another object of the present invention is to provide a method of manufacturing a semiconductor device employing the carrier type.

A carrier tape according to the present invention comprises an insulating film having a center device hole for receiving a semiconductor chip therein, a plurality of outer lead holes formed at the periphery of the center device hole, a lead supporting portion positioned between the center device hole and the outer lead holes, and a link portion positioned between one pair of mutually adjacent outer lead holes and connected, at one end thereof, to the lead supporting portion, the link portion being formed with an opening or a recess for passage of molten resin during the resin molding of the semiconductor chip; and a plurality of leads supported on the lead supporting portion of the insulating film, one of the respective end portions of each of the leads projecting into the center device hole of the insulating film.

A method of manufacturing a semiconductor device according to the present invention comprises the steps of: positioning a semiconductor chip having plurality or electrodes within a center device hole in an insulating film of a carrier tape including the film and a plurality of leads, a plurality of outer lead holes formed at the periphery of the center device hole, a lead supporting portion positioned between the center device hole and the outer lead holes, and a link portion positioned between one pair of mutually adjacent outer lead holes and connected, at one end thereof, to the lead supporting portion, the link portion being formed with an opening or a recess, the plurality of leads of the carrier tape being supported on the lead supporting portion or the insulating film, respective end portions of each of the leads projecting into the center device hole of the insulating film; electrically connecting the respective end portions of the plurality of leads to the corresponding electrodes of the semiconductor chip; placing the semiconductor chip within a cavity of a mold; injecting a molten resin into the cavity of the mod while the opening or the recess formed in the line portion of the insulating film serves as a passage through which the molten resin flows; and curing of the molten resin.

DESCRIPTION OF THE PREFERRED EMBODIMENTS

Certain embodiments of the present invention will now be described with reference to the accompanying drawings.

Figure 1A:
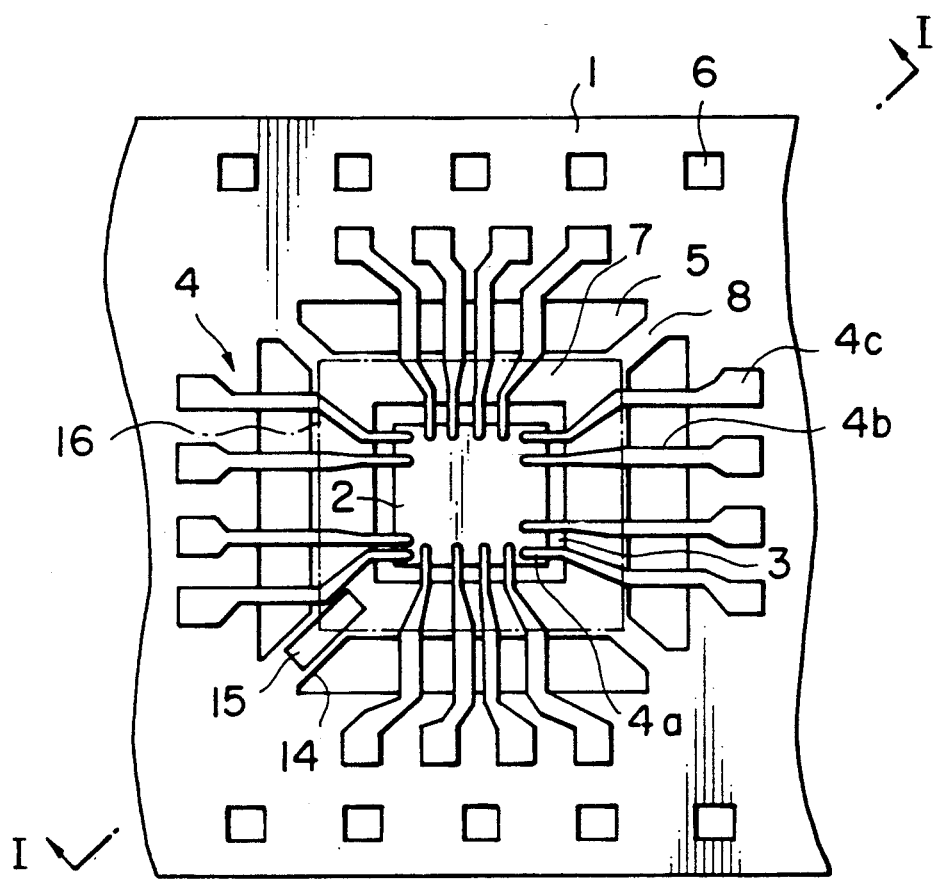
FIG. 1A is a fragmentary plan view of a carrier tape in accordance with a first embodiment of the present invention.
Figure 1B:
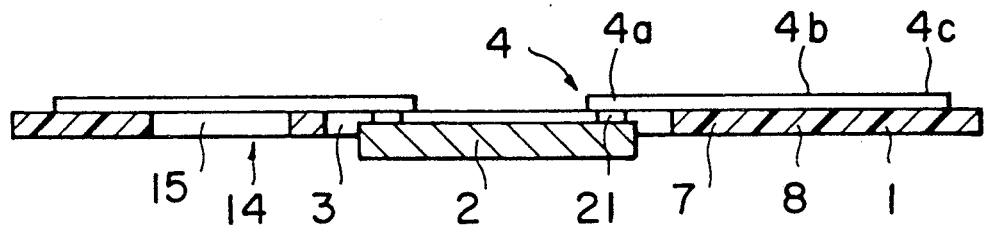
FIG. 1B is a sectional view taken along the line I—I shown in FIG. 1A.

Referring to FIGS. 1A and 1B, a carrier tape has an insulating film 1 formed of such a material as polyimide. The film 1 has a plurality of perforations 6 formed at equal intervals along its edges, and a rectangular center device hole 3 disposed centrally between the edges for receiving a semiconductor chip 2. A plurality of outer lead holes 5 are formed at the periphery of the center device hole 3. A plurality of leads 4 formed of copper are secured to the surface of the film 1. These leads 4 are supported by a lead supporting portion 7 positioned between the center device hole 3 and the outer lead holes 5. A front end of each lead 4 projects into the center device hole 3 as an inner lead 4a, while an intermediate portion of the lead 4 is positioned above the corresponding outer lead hole 5 as an outer lead 4b for connection to an external circuit. A test pad 4c is formed at the rear end of each lead 4. The lead supporting portion 7 is linked, at four corners, to the film 1 by bridge portions 8 each positioned between two adjacent outer lead holes 5.

One of the four bridge portions 8 constitutes a link portion 14. An opening 15 is formed in the link portion 14. The opening 15 is formed to extend across a mold line 16 indicating the boundary of an area which becomes sealed with a resin during a molding process. During the resin molding of the semiconductor chip 2, the opening 15 of the link portion 14 serves as a passage through which molten resin flows.

Next, descriptions will be given of a method of manufacturing a semiconductor device employing the carrier tape having the above-described construction.

First, as shown in FIG. 1B, a semiconductor chip 2 having a plurality of bump electrodes 21 formed on the surface thereof is positioned within the center device hole 3 of the carrier tape in such a manner that the position of each of the bump electrodes 21 is aligned with one of the inner leads 4a. Thereafter, the bump electrodes 21 and the inner leads 4a are thermocompression bonded together. A tape carrier is formed in this manner.

Figure 2:
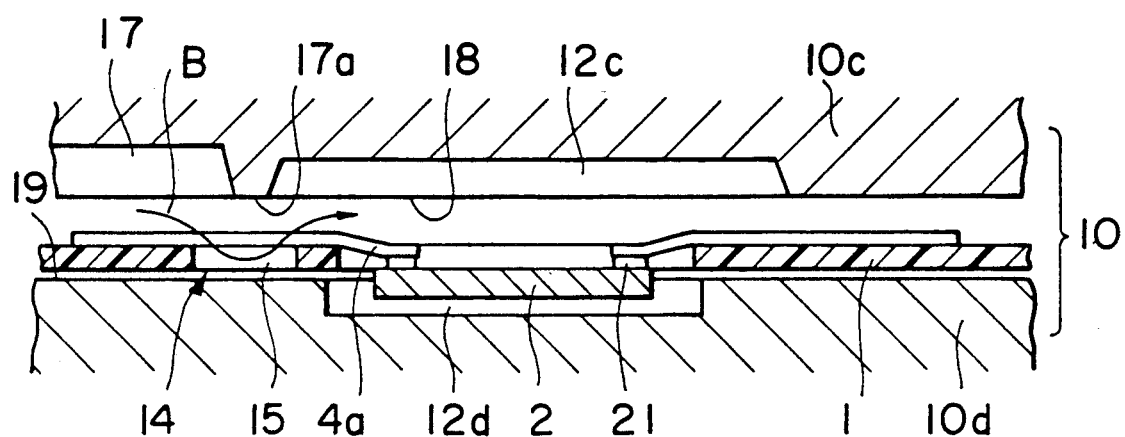
FIGS. 2 and 3 are sectional views showing steps in a method of manufacturing a semiconductor device employing the carrier tape in accordance with the first embodiment.

Subsequently, as shown in FIG. 2, the tape carrier is set between an upper mold part 10c and a lower mold part 10d which constitute a mold 10. At this time, the tape carrier is aligned in such a manner that the semiconductor chip 2 is received in a cavity half 12d of the lower mold part 10d. The upper mold part 10c is formed with a cavity half 12c corresponding to the cavity half 12d of the lower mold part 10d, and with a groove-shaped gate 17 extending toward the cavity half 12c and disposed at a position corresponding to the link portion 14 of the carrier tape. The gate 17 has a width which is slightly narrower than that of the link portion 14 of the carrier tape and is approximately equal to that of the opening 15. The boundary between the gate 17 and the cavity half 12c of the upper mold part 10c is located at a position corresponding to the opening 15 of the link portion 14 of the carrier tape, and a gate land 17a is disposed at this position. The height of the gate land 17a is such that the gate land 17a is substantially flush with a parting surface 18 of the upper mold part 10a.

After the placement of the tape carrier, the upper mold part 10c and the lower mold part 10d are clamped, and a molten resin 11, such as an epoxy resin, is injected by a low-pressure transfer method into a cavity defined by the cavity half 12c of the upper mold part 10c and the cavity half 12d of the lower mold part 10d, through the gate 17. As stated before, since the groove-shaped gate 17 formed in the upper mold part 10c has a narrower width than the link portion 14 of the carrier tape, when the upper mold part 10c and the lower mold part 10d are together, the gate 17 does not communicate with the outer lead holes 5 but has its lower portion closed by the link portion 14 and a parting surface 19 of the lower mold part 10d. By virtue of this arrangement, during the injection of a resin 11, the resin 11 flows from the gate 17 into the cavity through the opening 15 of the link portion 14 positioned below the gate land 17a, as indicated by an arrow B in FIG. 2. In this way, the resin 11 prevented from flowing into the outer lead holes 5 of carrier tape.

Figure 3:
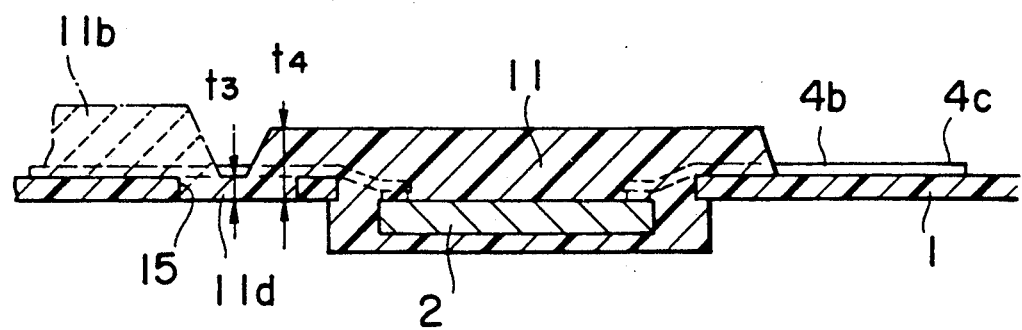

After the thus injected resin 11 been cured, the upper mold part 10c and the lower mold part 10d opened, and a molded product, such as that shown FIG. 3, is taken out from the mold 10. Subsequently, a gate-breaking process is carried out, in which the molded resin 11 is broken at a portion 11d corresponding to the gate land 17a of the upper mold part 10a, thereby removing an unnecessary, gate-corresponding portion 11b of the molded resin 11. At this time, as shown in FIG. 3, the portion of the molded resin 11 which is within the opening 15 of the carrier tape and which will serve as a part of a package of a semiconductor device has a thickness t4 that is greater than the thickness t3 of the resin portion 11d corresponding to the gate land 17a of the upper mold part 10c. By virtue of this feature, the gate-breaking process does not involve the risk of chipping a package-forming portion of the molded resin 11.

Furthermore, each of the leads 4 is cut along the boundary between the outer lead 4b and the test pad 4c, and the bridge portions 8 as well as the link portion 14 of the carrier tape are each cut off, thereby producing a semiconductor device.

Figure 9:
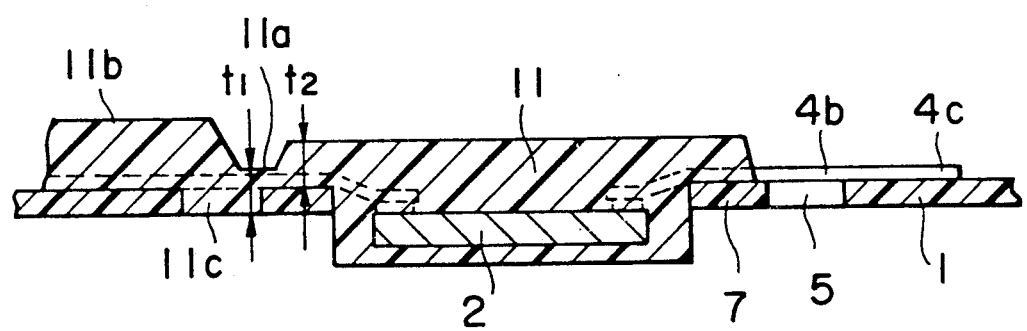

As described above, since, during resin molding, resin 11 is prevented from entering the outer lead holes 5 of the carrier tape, there is no need to remove any unnecessary molded resin portion, such as 11c shown in FIG. 9, after the molding process. It is therefore possible to avoid the risk of breaking the outer leads 4b of the leads 4. It is also possible to prevent any chipping of the package-forming portion of the molded resin 11 during the gate-breaking process.

In the above-described embodiment, the gate land 17a formed in the upper mold part 10c is at a certain height it which it is substantially flush with the parting surface 18 of the upper mold part 10c. However, it suffices if the height of the gate land 17a allows, during resin molding, molten resin 11 to flow within the opening 15 of the carrier tape while the resin 11 is simultaneously flowing through the gap between the gateland 17a and the parting surface 19 of the lower mold part 10d. Therefore, the height of the gate land 17a may be either at a level higher than the parting surface 18 of the upper mold part 10c, or at a level below the same.

Figure 4:
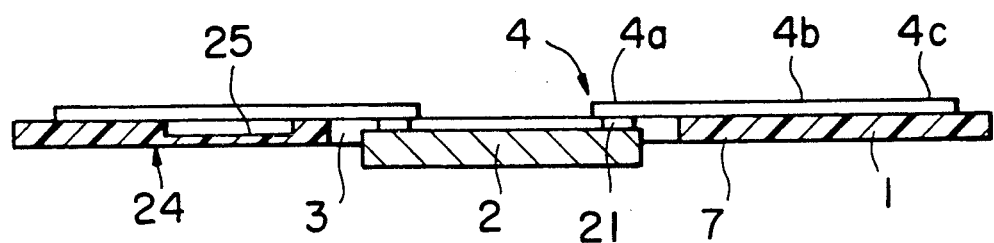
FIG. 4 is a sectional view of a carrier tape in accordance with a second embodiment of the present invention.
Figure 5:
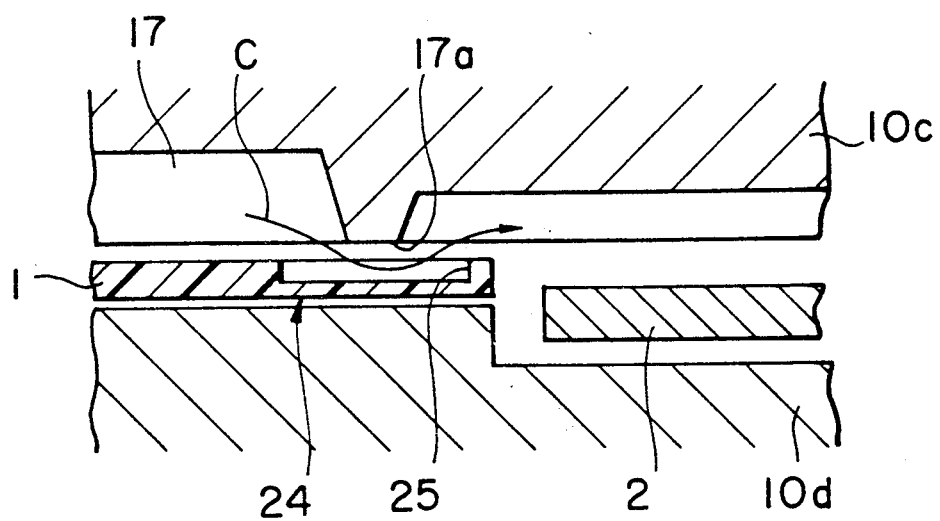
FIG. 5 is a sectional view illustrating a method of manufacturing a semiconductor device employing the carrier tape in accordance with the second embodiment.

The passage allowing the flow therethrough of molten resin 11, which is formed in the link portion 14 of the carrier tape, may not necessarily be in the form of an opening. Instead, this passage may be a recess 25 formed in the upper surface of a link portion 24, as shown in FIG. 4. In this case, during resin molding, molten resin is introduced from the gate 17 of the upper mold part 10c to the cavity through the recess 25 of the carrier tape thick which is positioned immediately below the gate land 17a, as indicated by an arrow C in FIG. 5.

Figure 6:
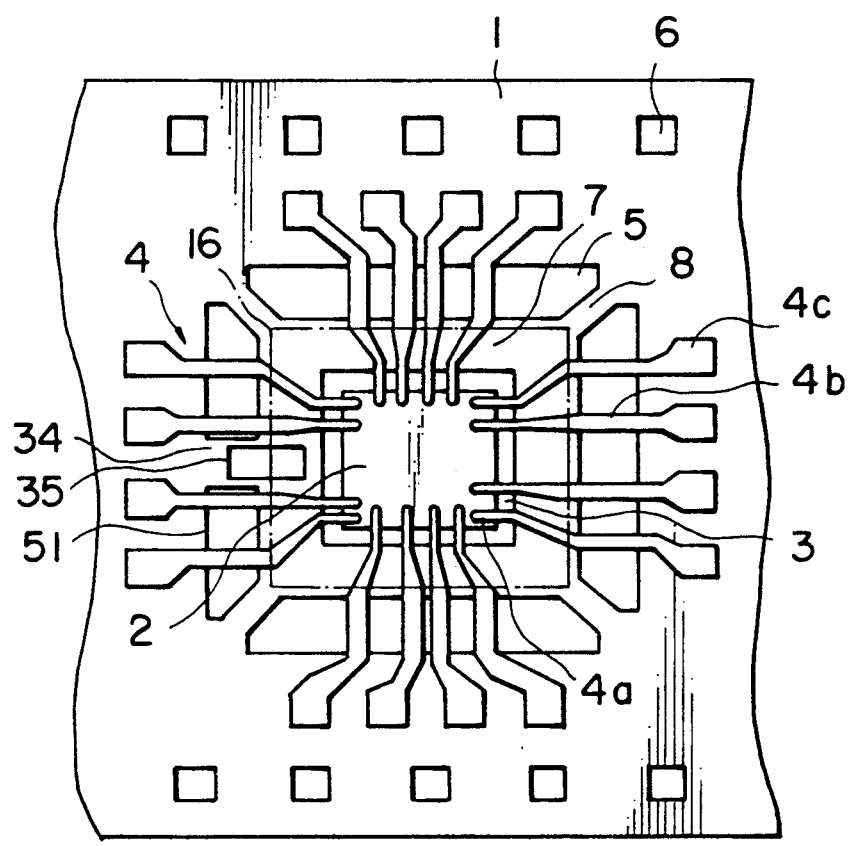
FIG. 6 is a fragmentary plan view of a carrier tape in accordance with a third embodiment of the present invention.
Figure 7A:
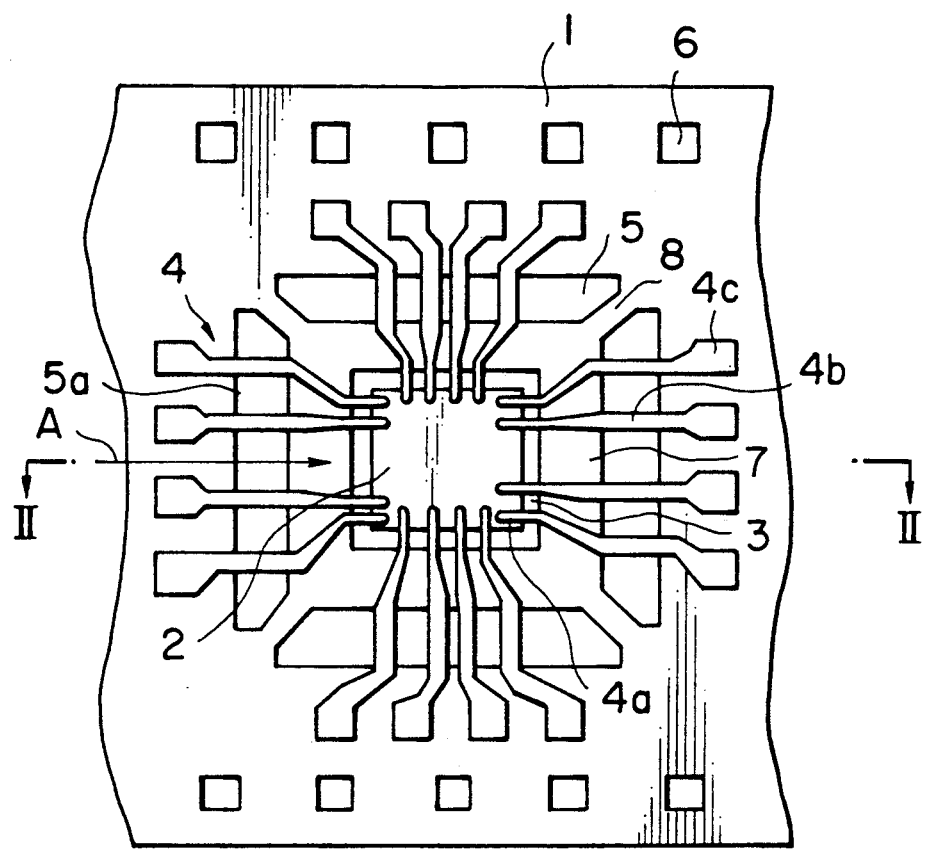
FIG. 7A is a fragmentary plan view of a conventional carrier tape.
Figure 7B:
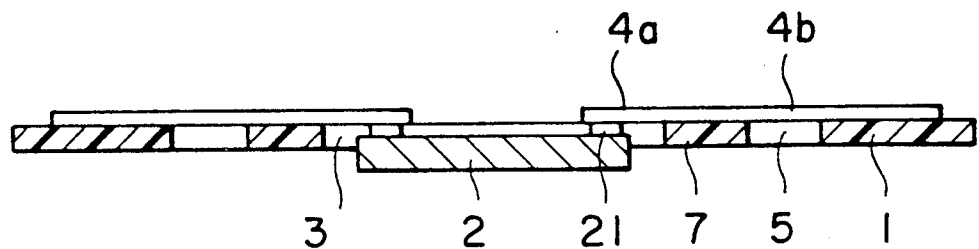
FIG. 7B is a sectional view taken along the line II—II shown in FIG. 7A.
Figure 8:
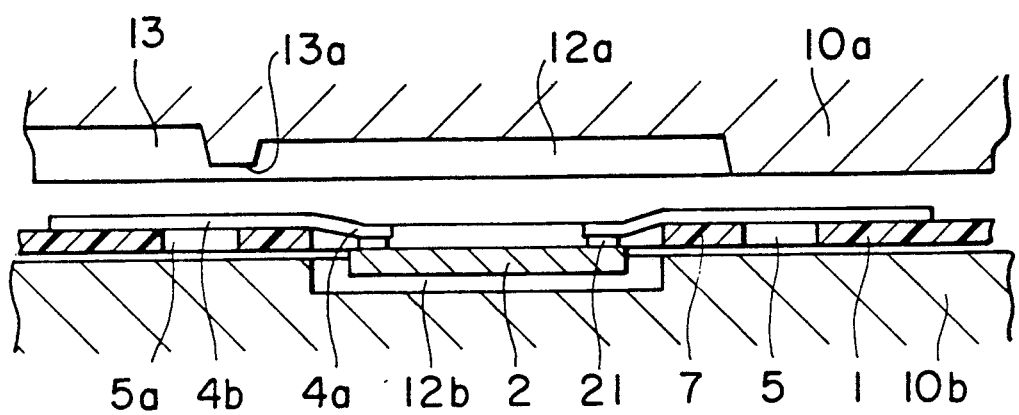
FIGS. 8 and 9 are sectional views showing steps in a conventional method of manufacturing a semiconductor device.

Further, the location of the link portion in the carrier tape may not necessarily by a bridge portion 8. For instance, as shown in FIG. 6, a link portion 34 may be formed dividing an outer lead hole 51 be connected, at the end thereof, to the lead supporting portion 7. Also in this case, an opening 35 or a recess formed in the link portion 34 extends across the mold line 16.

When the semiconductor chip 2 to be mounted has such a large size that the sides of the lead supporting portion 7 have a length equal to or greater than a predetermined value, the following arrangement may be adopted so as to prevent the lead supporting portion 7 from sagging under its own weight. The center tie bars are provided either in one pair of outer lead holes 5 which mutually oppose each other with the center device hole 3 positioned therebetween or in all the four outer lead holes 5 with each center tie bar dividing the associated outer lead hole 5 and connected, at one end thereof, to the lead supporting portion 7. In this case, therefore, one of the center tie bars is used as the link portion of the carrier tape.

Furthermore, the number of the link portions provided may not necessarily only one. Instead, a plurality of link portions may be connected, at one of their respective ends, to the lead supporting portion 7, and a molten resin may be injected through a plurality of passages while an opening or a recess formed in each of the link portions providing a flow passage.

What is claimed is:

1. A carrier tape comprising:
    an electrically insulating film including a center device hole for receiving a semiconductor chip therein, a plurality of outer lead holes spaced from and disposed at the periphery of the center device hole, a lead supporting portion positioned between the center device hole and the outer lead holes, and a link portion positioned between a pair of adjacent outer lead holes and connected to said lead supporting portion, said link portion including a recess in said insulating film, extending into said lead supporting portion and spaced from the center device hole for limiting the flow path of molten resin toward the center device hole from said insulating film beyond the outer lead holes during resin molding of the semiconductor chip; and
    a plurality of leads, each lead having first and second ends, being supported on said lead supporting portion of said insulating film, and crossing one of the outer lead holes, the first ends of said leads projecting into the center device hole of said insulating film.

2. A carrier tape according to claim 1 wherein said insulating film includes a plurality of bridge portions connecting said lead supporting portion to said insulating film at the outer lead holes opposite the center device hole, at least one of said bridge portions including said link portion.

3. A tape carrier according to claim 1 including a plurality of link portions, each link portion including a recess for limiting the flow path of molten resin during resin molding of the semiconductor chip.

* * * * *